United States Patent [19]

Stickney

[11] Patent Number: 4,864,076
[45] Date of Patent: Sep. 5, 1989

[54] ELECTROMAGNETIC SHIELDING AND ENVIRONMENTAL SEALING DEVICE

[75] Inventor: William H. Stickney, Cresco, Pa.
[73] Assignee: Instrument Specialties Co., Inc., Delaware Water Gap, Pa.
[21] Appl. No.: 261,415
[22] Filed: Oct. 24, 1988
[51] Int. Cl.⁴ .............................................. H05K 9/00
[52] U.S. Cl. ................................................ 174/35 GC
[58] Field of Search ........... 174/35 GC; 219/10.55 D; 277/90, 235 R

[56] References Cited

U.S. PATENT DOCUMENTS

| | | | |
|---|---|---|---|
| 2,674,644 | 4/1954 | Goodloe | 174/35 GC |
| 2,783,295 | 2/1957 | Ewing | 174/35 GC |
| 2,966,539 | 12/1960 | Sears et al. | 174/35 GC X |
| 2,974,183 | 3/1961 | Kes et al. | 174/35 GC |
| 3,026,367 | 3/1962 | Hartwell | 174/35 GC |
| 3,502,784 | 3/1970 | Kunkel | 174/35 GC |
| 3,504,095 | 3/1970 | Roberson et al. | 174/35 GC |
| 3,904,810 | 9/1975 | Kraus | 174/35 GC X |
| 4,065,138 | 12/1977 | Severinsen | 174/35 GC X |
| 4,525,595 | 6/1985 | Harriman | 174/35 GC X |
| 4,543,447 | 9/1985 | Brewer | 174/35 GC |
| 4,567,336 | 1/1986 | Lemche | 174/35 GC |
| 4,572,921 | 2/1986 | May et al. | 174/35 GC |
| 4,623,752 | 11/1986 | Steen et al. | 174/35 GC |
| 4,652,695 | 3/1987 | Busby | 174/35 GC |
| 4,659,869 | 4/1987 | Busby | 174/35 GC |
| 4,754,101 | 6/1988 | Stickney et al. | 174/35 R |

OTHER PUBLICATIONS

Product Brochure, Spira Manufacturing Corporation.
Product Brochure, pp. 49–52, 54–57, 62 and 63.

Primary Examiner—Arthur T. Grimley
Assistant Examiner—David A. Tone
Attorney, Agent, or Firm—Burns, Doane, Swecker & Mathis

[57] ABSTRACT

An electromagnetic shielding and environmental sealing device includes an elastomer strip that is attached to a metal strip. The metal strip includes a base member and a plurality of fingers that extend from one edge of the base member at an angle. The elastomer strip includes a base portion, an extension portion that is attached to one edge of the base portion and extends at an angle with respect to the base portion and a sealing portion that is attached to the opposite edge of the base portion. The base member of the metal strip has a plurality of cut-out areas positioned therein that define contact tabs. The contact tabs are capable of deflecting out of the plane defined by immediately adjoining areas of the base member when a force is applied to the device. In that way, proper electrical contact is maintained with respect to the device and the surface to which it is attached.

27 Claims, 3 Drawing Sheets

ELECTROMAGNETIC SHIELDING AND ENVIRONMENTAL SEALING DEVICE

BACKGROUND AND SUMMARY OF THE PRESENT INVENTION

The present invention relates to a device for minimizing the electromagnetic interference from an electrical or electronic apparatus and for containing the electromagnetic emissions from such an apparatus. More particularly, the present invention concerns an electromagnetic shielding and environmental sealing device for shielding and sealing two adjacent members having opposed surfaces with a space therebetween.

Electromagnetic shielding of structures such as test rooms and electronic components used in radio transmitters, radio receivers, computers and other electronic devices, is highly desirable. The various types of components used in such structures emit electromagnetic waves that might adversely affect the operation of other apparatus and devices located in the surrounding area. Thus, in order to prevent interference with other apparatus in the surrounding area, the electromagnetic waves must be contained within the structure and effectively prevented from emanating out of the structure.

Similar concerns also arise with respect to the possible adverse affects that electromagnetic waves emitted from devices in the surrounding area may have on the electric and electronic components contained within the aforementioned structures. Thus, in addition to sealing such structures to prevent emission of electromagnetic waves, it is also necessary that such structures be sealed from electromagnetic waves originating from other sources.

Environmental conditions such as dirt, dust, ventilating air and the like are of similar importance in the aforementioned structures because such environmental conditions can have a detrimental impact on the continued operation and functioning of the components contained within the structures. Thus, in order to ensure continued operation of the components, it is important that the structure be effectively sealed from potentially harmful environmental conditions.

The aforementioned structures which house electronic components and similar devices commonly employ movable or removable members in the form of doors, drawers, access panels and the like. The movable and removable members include hinged members that result in a swinging type closure as well as sliding members that result in a sliding type closure. It is highly desirable to effectively seal the joints defined by such movable and removable members from the potentially harmful effects of environmental conditions. Further, it is highly desirable that such joints be effectively shielded to isolate internally produced electromagnetic waves within the structure while also preventing interference from outside electromagnetic waves.

A variety of different devices have been proposed for shielding electronic components but those prior art devices have not been entirely satisfactory. In one respect, the prior art devices are not entirely effective in sealing the joints from the environmental conditions which can adversely affect the operation of the electronic components. Also, the prior art devices are not entirely suitable for use in structures which have swinging doors, panels and the like as well as structures having sliding doors, panels and the like. In the case of sliding doors, panels and the like, the forces applied to the shielding arrangement can adversely affect the structural integrity of the shielding arrangement and thereby cause a loss in proper electrical contact between the opposed surfaces of the joint. A further unsatisfactory characteristic of some of the prior art combination seals is the inability of the devices to maintain electrical contact between the opposed surfaces of the joint when a force, such as that produced when the opposing surfaces of the closure interface are brought together, is applied to the shielding device.

One prior art shielding arrangement is disclosed in U.S. Pat. No. 4,659,869 issued Apr. 21, 1987 to Busby. The arrangement disclosed in that patent includes a metal clip element having an elastomer strip attached to one surface thereof. The metal clip element is comprised of a strip of metal that is bent through an angle greater than 180° and thus, the clip element with the attached elastomer strip can be clipped onto the door of a cabinet containing electronic equipment.

Another prior art shielding arrangement is disclosed in U.S. Pat. No. 3,904,810 issued Sept. 9, 1975 to Kraus. The arrangement disclosed in that patent includes a spring strip that is mounted on an access door of a housing by mounting strips. The spring strip has a plurality of spring fingers that extend therefrom at an angle. Each of the spring fingers has a protuberance located on one surface thereof which is intended to contact the frame of the housing to thereby provide electrical contact.

Other prior art shielding arrangements are disclosed in U.S. Pat. Nos. 4,525,595 issued June 25, 1985 to Harriman; 4,065,138 issued Dec. 27, 1977 to Severinsen; 4,652,695 issued Mar. 24, 1987 to Busby; and 4,623,752 issued Nov. 18, 1986 to Steen et al. However, the above-described prior art devices are not entirely satisfactory because they suffer from one or more of the aforementioned disadvantages.

The aforementioned disadvantages of the prior art are overcome by an electromagnetic shielding and environmental sealing device in accordance with the present invention which includes an elastomer strip and a metal strip. The metal strip includes a base member and a plurality of spaced fingers that are integrally connected to an edge of the base member and that extend from the base member at an acute angle. The base member of the metal strip includes means for permitting a portion of the base member to be deflected out of the plane defined by immediately adjoining portions of the base member when a force is applied to the fingers. In a preferred embodiment, the means for permitting a portion of the base member to be deflected comprises at least one U-shaped cut-out area that defines a rectangular contact tab. The free end of each finger has a tip portion integrally connected thereto that extends back towards the finger at an angle. The elastomer strip includes a base portion, an extension portion attached to and extending at an angle from one edge of the base element and a sealing portion attached to an opposite edge of the base element. The elastomer strip is positioned with respect to the metal strip such that (a) the base portion of the elastomer strip extends along the base member of the metal strip, (b) the extension portion of the elastomer strip extends along the fingers, and (c) the sealing portion of the elastomer strip is positioned beyond an edge of the base member of the metal strip.

BRIEF DESCRIPTION OF THE DRAWINGS

Preferred embodiments of the present invention will be described in greater detail with reference to the accompanying drawings, wherein like elements bear like reference numerals and wherein.

DETAILED DESCRIPTION OF THE PREFERRED EMBODIMENTS

Figure 1:
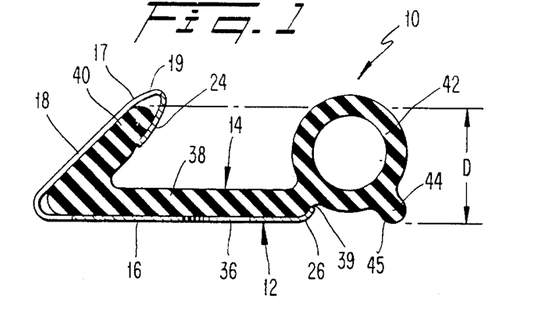
FIG. 1 is a cross-sectional view of a first preferred embodiment of an electromagnetic shielding and environmental sealing device according to the present invention.

With reference to FIG. 1, the electromagnetic shielding and environmental sealing device 10 according to the preferred embodiment of the present invention includes a metal strip 12 and an elastomer strip 14. The metal strip 12 includes a base member 16 and a plurality of fingers 18 that are integrally connected to one edge of the base member 16. A tip portion 24 is integrally connected to the free end of each of the fingers 18. The metal strip 12 also includes a lip 26 that is integrally connected to an edge of the metal strip 12 which is opposite the edge to which the fingers 18 are integrally connected.

The elastomer strip 14 includes a base portion 38 and an extension portion 40 that is integrally connected to one edge of the base portion 38. A sealing portion 42 is integrally connected to an edge of the base portion 38 that is opposite the edge to which the extension portion 40 is integrally connected. The sealing portion 42 is slightly raised with respect to the bottom surface of the base portion 38 to thereby define a curved edge surface 39. Thus, the slightly upturned lip 26 of the metal strip 12 is able to contact the curved edge surface 39 of the elastomer strip 14. In that way, the slightly upturned lip 26 helps retain the elastomer strip 14 in position with respect to the metal strip 12

Figure 2:
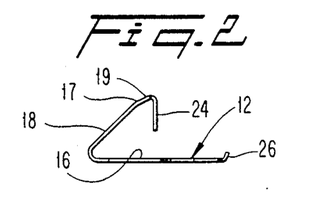
FIG. 2 is a left end view of the metal strip on a reduced scale.
Figure 16:
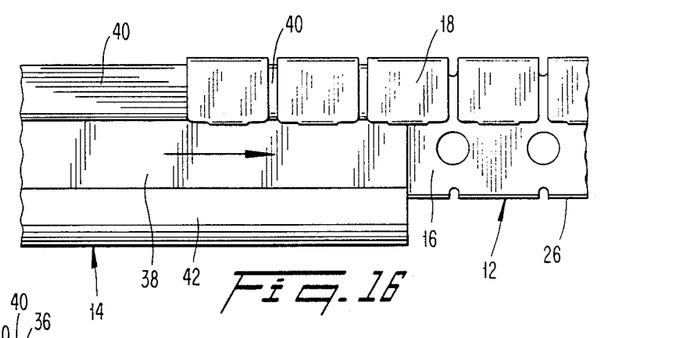
FIG. 16 is a top view of a portion of the electromagnetic shielding and environmental sealing device as the elastomer strip is inserted into the metal strip from the left side.

As seen in FIG. 2, when the metal strip 12 is initially manufactured, the tip portions 24 are substantially perpendicular to the base member 16. That construction is desirable because when the elastomer strip 14 is inserted into the metal strip 12 as depicted in FIG. 16, a sufficiently large space is provided between the tip portions 24 and the fingers 18 to accommodate the extension portion 40 of the elastomer strip 14. Thus, the insertion of the elastomer strip 14 into the metal strip 12 is not obstructed by contact between the extension portion 40 and the tip portions 24 and the fingers 18.

As also seen in FIG. 2, the upper portion 19 of each of the fingers 18 is connected to the lower portion of the fingers 18 by a portion 17 having a particular radius of curvature. The straight upper portions 19 of the fingers 18 are thus angled with respect to the lower portion of the fingers 18. The straight upper portion 19 is designed to provide a large surface area for engagement with the surface of the structure or housing which it is intended to contact. In that way, better contact can be maintained between the two opposing surfaces that define the joint of the structure or housing. Preferably, immediately after manufacturing, the fingers 18 are all coplanar and the angle between the fingers 18 and the base member is approximately 45°. The radius of curvature of portion 17 should be large enough that the fingers 18 preferably form an angle of approximately 25° with the straight upper portions 19 of the fingers 18. Accordingly, the straight upper portions 19 of the fingers 18 form an angle of approximately 20° with the base member 16.

Figure 3:
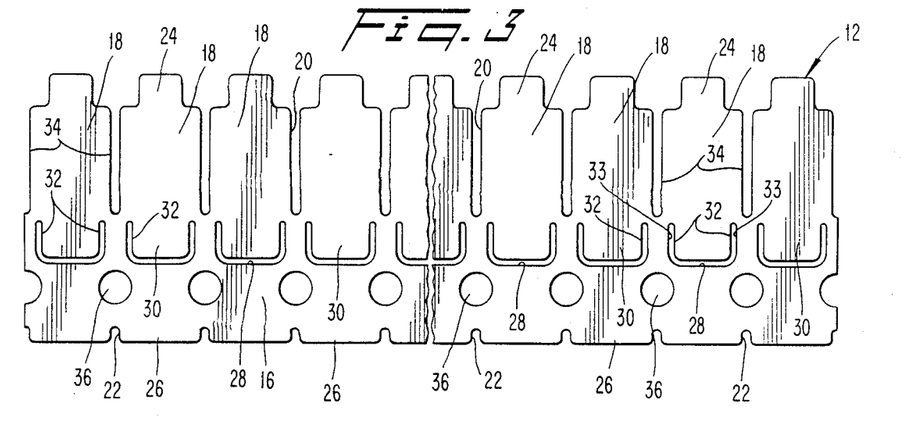
FIG. 3 is a top view of the metal strip in flat configuration.

Referring now to FIG. 3, the metal strip 12, as previously described, includes a base member 16, a plurality of fingers 18 integrally connected to one edge of the base member 16 and a tip portion 24 extending from each of the fingers 18. The fingers 18 are spaced from each other and thereby define slots 20 between adjacent fingers 18.

Figure 7:
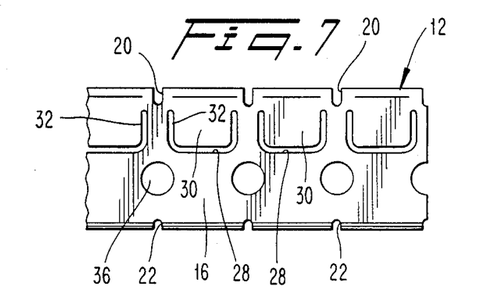
FIG. 7 is a bottom view of a portion of the metal strip.

As seen in FIG. 7, the slots 20 extend slightly into the base portion 16 of the metal strip 12. The width of the slots 20 should preferably be as small as possible. Moreover, the width of the slots 20 must be smaller than one-half of the wavelength of the electromagnetic emissions. Otherwise, it would be possible for the electromagnetic emissions to pass between the fingers 18.

The edge of the base member 16 to which the lip 26 is integrally connected includes a plurality of spaced notches 22 as depicted in FIG. 3. Each one of the notches 22 is aligned with one of the slots 20. The aligned slots 22 and notches 20 facilitate bending of the metal strip 12 as well as bending of the entire device 10. In that way, the device 10 can be bent and shaped to conform to corners and a variety of different surface configurations. Moreover, the aligned slots 20 and notches 22 permit the device 10 to be readily out into any desired length.

The base member 16 of the metal strip 12 further includes a plurality of U-shaped cut-out areas 28 that define rectangular contact tabs 30 as shown in FIG. 3. Each of the U-shaped cut-out areas 28 and each of the rectangular contact tabs 30 is aligned with and is associated with a corresponding one of fingers 18. The open end of each of the U-shaped cut-out areas 28 faces the associated finger 18. Moreover, the sides 33 of each of the U-shaped cut-out areas 28 and the sides 32 of each of the rectangular contact tabs 30 are in parallel alignment with the sides 34 of the fingers 18. The open end of each of the U-shaped cut-out areas 28 terminates just short of the fingers 18 so that a narrow strip of the base member 16 exists between the ends of the slots 20 and the ends of the U-shaped cut-out areas 28 that are closest to each other.

It can be seen from FIG. 3 that the rectangular contact tabs 30 are positioned with respect to the associated finger 18 such that imaginary continuations of the sides 32 defining the rectangular contact tabs 30 are positioned between the sides 34 defining the fingers 18. As a result of the positioning of the contact tabs 30 relative to the associated fingers 18, the contact tabs 30 are capable of being deflected out of the plane defined by immediately adjoining areas of the base member 16 when a force is applied to the fingers 18. When a force is applied to the fingers 18, the rectangular contact tabs 30 deflect out of the plane defined by the immediately adjoining areas of the base member and thereby contact the underlying surface to which the device 10 is attached. As the contact tabs 30 are in their deflected state, spaces are formed between the adjacent sides 32 of adjoining tabs 30. The spaces formed by the adjacent sides 32 of adjoining deflected tabs 30 must be smaller than one-half the wavelength of the electromagnetic emissions or else the electromagnetic emissions will pass between such spaces. In that way, the spacing between adjacent sides 32 in adjoining contact tabs 30 will be small enough that the deflected contact tabs 30 will behave as though they form a single, unseparated strip. Moreover, since the spacing between adjacent fingers 18 is smaller than the distance between adjacent sides 32 of adjoining contact tabs 30, ensuring that the distance between adjacent sides 32 of adjoining contact tabs 30 is small enough to prevent electromagnetic emissions from passing therethrough will necessarily preclude electromagnetic emissions from passing through the slots 20 located between adjacent fingers 18.

As seen in FIG. 3, the base member 16 of the metal strip 12 further includes a plurality of spaced fastening holes 36 that permit the device 10 to be attached to any desired surface. Each of the fastening holes 36 is aligned with one of the slots 20 and one of the notches 22. Moreover, each of the fastening holes 36 is positioned between adjacent sides 32 of adjoining contact tabs 30. In that way, if fasteners are used to secure the device 10, the fasteners will not affect the ability of the contact tabs to deflect. While the preferred embodiment of the present invention has been described as including fastening holes 36 for fastening the device 10 to any desired surface, it is of course understood that other suitable arrangements such as adhesives or the like could be employed or provided to secure the device 10.

Figure 4:
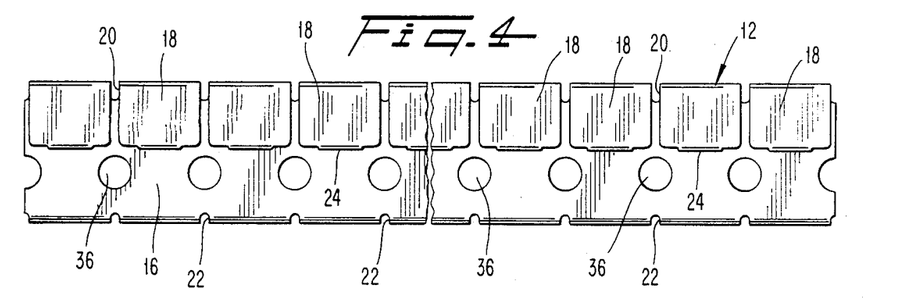
FIG. 4 is a top view of the metal strip.

FIG. 4 illustrates the positioning of the fastening holes 36 relative to the fingers 18 and the tip portions 24. The fastening holes 36 are spaced from the fingers 18 and the tip portions 24 in the direction of the upturned lip 26 such that if fasteners are used to secure the device 10, the fingers 18 and tip portions 24 do not interfere with the application of the fasteners.

Figure 5:
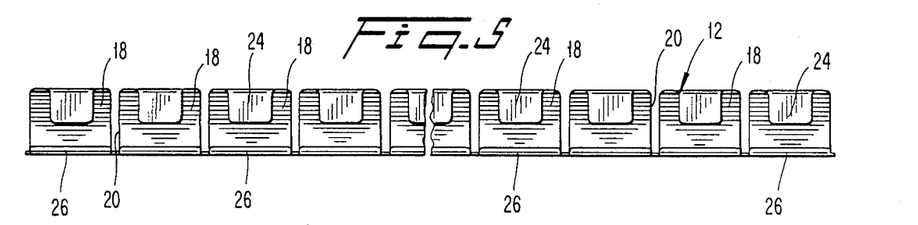
FIG. 5 is a front view of the metal strip.
Figure 6:
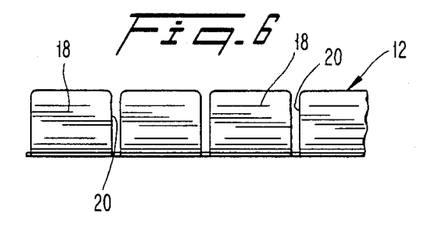
FIG. 6 is a rear view of a portion of the metal strip.

FIG. 5 illustrates the fact that the slots 20 extend along the entire length of the fingers 18 to completely separate the fingers 18. Further, FIG. 5 shows the extent to which the tip portions extend toward the base member 16. FIG. 6 also shows the slots 20 as extending along the entire length of the fingers 18.

Turning now to the features of the elastomer strip 14 as shown in FIG. 1?, the elastomer strip 14, as described previously, includes a base portion 38, an extension portion 40 integrally connected to one edge of the base portion 38 and a sealing portion 42 integrally connected to an opposite edge of the base portion 38. The extension portion 40 extends from the base portion 38 at an angle. The angle between the extension portion 40 and the base portion 38 is approximately equal to the angle between the fingers 18 and the base member 16 of the metal strip 12.

A protuberance 44 extends from the sealing portion 42. The point 45 on the protuberance 44 that is intended to contact the surface to which the device is attached is slightly lower than the bottom surface of the base portion 38. The distance between the point 45 on the protuberance 44 and the lower surface of the base portion 38 is substantially equal to the thickness of the base member 16 of the metal strip so that when the elastomer strip 14 and the metal strip 12 are assembled together, the point 45 on the protuberance 44 will be aligned with or slightly lower than the bottom surface of the base member 16 of the metal strip 12. As a result of that arrangement, when the device 10 is attached to a surface, the point 45 on the protuberance will contact the surface and thereby effectively seal the joint of the structure or housing from environmental conditions.

Figure 10:
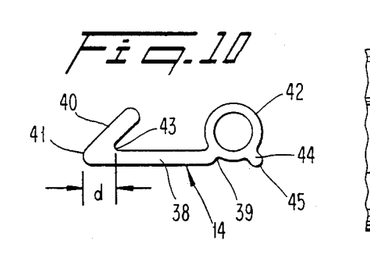
FIG. 10 is a left end view of the elastomer strip on a reduced scale.

As seen in FIG. 10, the distance d, defined as the distance between the edge of the base portion 38 and the apex 43 of the angle formed between the inner surface of the extension portion 40 and the inner surface of the base portion 38, is preferably equal to approximately one third of the length of the base portion 38. The distance defines what is referred to as the knuckle. In order to provide good stress distribution in the metal that surrounds the knuckle, the elastomer in the knuckle should be free of extruded voids. By varying the thickness of the elastomer strip 14, the distance and thus, the size of the knuckle can be varied. When the elastomer strip 14 is made thicker, the extension portion 40 and the base portion 38 become thicker and consequently, the intersection of those two portions which defines the knuckle is made larger. It can be seen that the distance d and the resulting size of the knuckle determines the pivot point of the extension portion 40 relative to the base portion 38. Thus, it is important to note that the position of the pivot point can be varied by changing the thickness of the elastomer strip 14.

The location of the pivot point can have an effect upon the deflection of the contact tab 30 in that if the pivot point of the extension portion 40 is positioned directly above the contact tab 30, the contact tab 30 will be more easily deflected than if the pivot point of the extension portion is spaced from the contact tab 30. Therefore, by varying the thickness of the elastomer strip, the ease with which the contact tab 30 can be deflected can also be varied.

Figure 8:
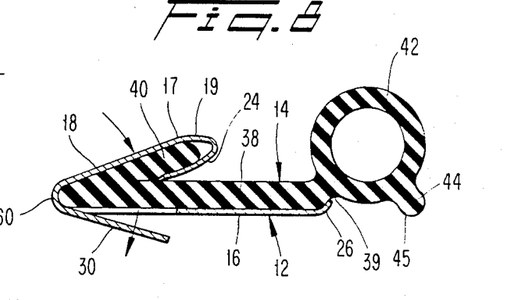
FIG. 8 is a cross-sectional view of the electromagnetic shielding and environmental sealing device as it is subjected to a force.

The presence of the elastomer strip 14 and the thickness of the elastomer strip 14 also affects the stress distribution in the metal strip 12. FIG. 8 shows the device 10 while it is being subjected to a force so that the fingers 18 and the extension portion 40 are deflected. If the elastomer strip 14 were not present, the deflection of the fingers 18 in the direction of the arrow as seen in FIG. 8 would case a stress build-up to occur at the bend 60. Continued deflection of the fingers 18 would result in additional stress build-up at the bend 60. However, due to the presence of the elastomer strip 14, the aforementioned stress distribution at the bend 60 is different.

As the fingers 18 and the extension portion 40 are initially deflected together, the localized bending of the metal strip 12 at the bend 60 causes a stress increase. However, as deflection increases, the portion of the elastomer strip 14 positioned in the bend 60 tends to resist further stress increases at the bend 60. The presence of the elastomer strip 14 at the bend 60 causes the point of localized bending to move along the fingers 18 away from the bend 60. Thus, while the bend 60 sees an initial stress increase due to bending of the fingers 18, further bending of the fingers 18 causes the stresses in the fingers adjacent the bend to increase. Moreover, the location of the stress increase moves further away from the bend 60 as deflection of the fingers 18 increases.

Accordingly, the stress in the metal strip 12 is distributed away from the bend 60 as a result of the outward force produced by the knuckle portion of the elastomer strip 14. This is a sharp contrast to earlier devices where increases in deflection result in increases in stress at the hairpin bend. Since the outward force produced by the knuckle portion of the elastomer strip 14 is dependent upon the size of the knuckle portion and since the size of the knuckle portion is a function of the thickness of the elastomer strip 14, it can be seen that the effective distribution of the stress in the metal strip 12 is dependent not only upon the presence of the elastomer strip 14 but also upon the thickness of the elastomer strip 14. If the thickness of the elastomer strip 14 is not sufficient to define a knuckle portion that is capable of producing an outward force against the fingers 18, the stress in the bend 60 will not be effectively distributed to the fingers 18. It has been found preferable that the length of the extension portion 40 from the free end of the extension portion 40 to the tip of the knuckle is approximately 4.6 times the thickness of the base portion of the elastomer strip, although elastomer strips of other thicknesses could be employed depending upon, for example, the amount and extent of stress distribution desired in the metal strip.

As best seen in FIG. 10, the highest point on the sealing portion 42 is slightly higher than the highest point on the extension portion 40. That arrangement helps insure that an environmental seal will be maintained with respect to the surface of the joint in the structure or housing that contacts the upper surface of the sealing member 42. As also shown in FIG. 10, the rightmost point on the outer surface of the protuberance 44 is substantially aligned with the rightmost point on the outer surface of the sealing portion 42.

Figure 11:
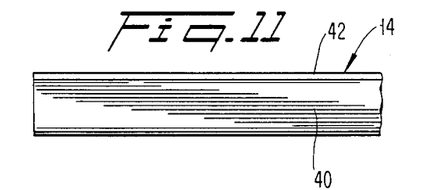
FIG. 11 is a rear view of a portion of the elastomer strip.
Figure 12:
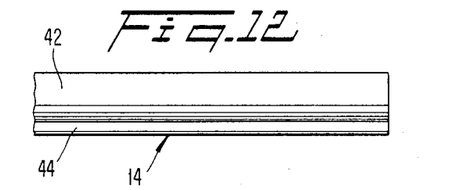
FIG. 12 is a front view of a portion of the elastomer strip.
Figure 13:
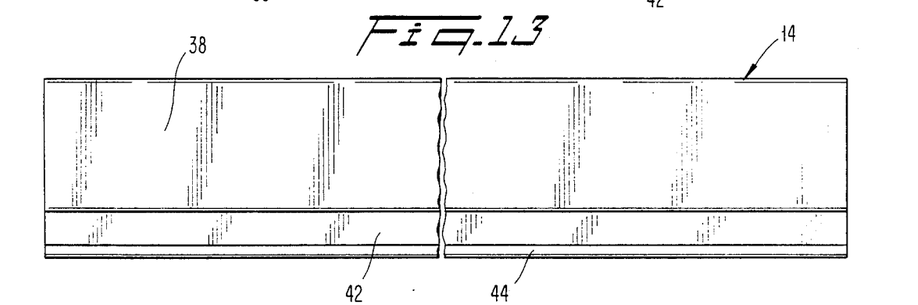
FIG. 13 is a bottom view of the elastomer strip.

FIG. 11 shows the elastomer strip 14 from a different view and serves to further illustrate the fact that the uppermost point on the sealing portion 42 is positioned slightly higher than the uppermost point on the extension portion 40.

Figure 14:
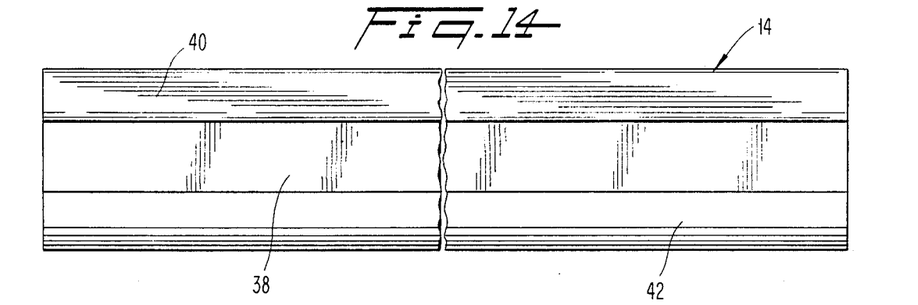
FIG. 14 is a top view of the elastomer strip.

With reference to FIG. 14, both the extension portion 40 and the sealing portion 42 extend along the entire length of the base portion 38 of the elastomer strip 14. Moreover, the extension portion 40 and the sealing portion 42 are in substantially parallel alignment with each other.

Figure 18:
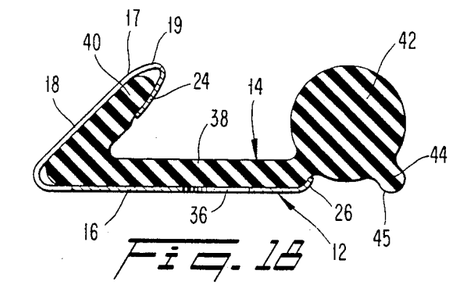
FIG. 18 is a cross-sectional view of another embodiment of an electromagnetic shielding and environmental sealing device according to the present invention.

The sealing portion 42 of the elastomer strip 14 is shown in FIG. 1 as being hollow and cylindrical. However, the sealing portion 42 could be configured in other shapes and arrangements depending upon the particular environmental conditions involved. For instance, FIG. 18 shows a sealing portion 42 that is cylindrical and solid. Assuming that the sealing portions 42 depicted in FIGS. 1 and 18 are made of the same material, the solid sealing portion 42 shown in FIG. 18 would be much stiffer than the sealing portion 42 shown in FIG. 1. Thus, one would want to employ a sealing portion 42 similar to that depicted in FIG. 1 if the structure or housing to which the device is to be attached is subjected to environmental conditions that are most effectively sealed by a stiffer seal. Conversely, if the environmental conditions suggest that a softer seal would be most effective, then the hollow sealing portion shown in FIG. 1 would be the best choice. It is, of course, envisioned that variations other than those shown in FIGS. 1 and 18 could be employed. For instance, hollow sealing portions having thicker or thinner walls than that shown in FIG. 1 could be utilized. Similarly, the characteristics of the solid sealing portion shown in FIG. 18 could be varied by using different materials having different resiliencies.

Figure 9:
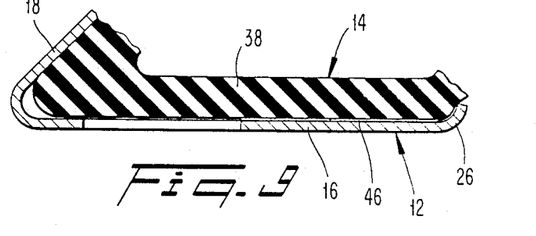
FIG. 9 is an enlarged cross-sectional view of a portion of the device illustrating a preferred embodiment of an attaching means for attaching the elastomer strip to the metal strip.

As depicted in FIG. 9, an adhesive layer 46 can be provided between the base portion 38 of the elastomer strip 14 and the base member 16 of the metal strip 12 to thereby secure the elastomer strip 14 to the metal strip 12. The adhesive layer 46, as shows in FIG. 9, extends from the end of the contact tabs 30 located farthest from the fingers 18 to the edge of the base member 16 adjacent the upturned lip 26. In that way, the adhesive contact between the elastomer strip 14 and the metal strip 12 will not interfere with the deflection of the contact tab 30. Of course, other types of securing means could be employed for securing the elastomer strip 14 to the metal strip 12. Further yet, it may be desirable to simply forego the use of any type of securing means and thereby rely upon the structural configurations of the various parts of the metal strip 12 in order to secure the elastomer strip 14 in place relative to the metal strip 12. The interaction between the slightly upturned lip 26 on the metal strip 12 and the curved edge surface 39 on the elastomer strip 14 in combination with the force exerted by the fingers 18 on the extension portion 40 would be entirely sufficient to retain the elastomer strip 14 in place relative to the metal strip 12.

The metal strip 12 is preferably manufactured from mill-hard beryllium copper although other suitable metals could be utilized. The elastomer strip 14 is preferably manufactured from silicone, neoprene, viton or any other similar extrudable material. Alternatively, elastomers containing electromagnetic energy absorbing materials could be employed for increasing the effectiveness of the device's electromagnetic shielding properties. Similarly, the use of conductive elastomer materials is within the purview of the present invention.

It may also be advantageous to manufacture the device 10 of the present invention by utilizing dual density or dual material elastomers. In the case of dual density elastomers, the base element 38 and the extension element 40 of the elastomer strip 14 could be manufactured from a solid elastomer material while the sealing portion 42 is manufactured from a closed-cell foam material. In that way, the contact force on the sealing portion 42 would be reduced while the strength of the remaining portions of the elastomer strip 14 would be maintained. In the case of dual material elastomers, the same objective could be achieved by bonding together two different elastomer materials having the desired properties and characteristics.

With reference to FIG. 16, the device 10 is assembled by sliding the elastomer strip 14 into the metal strip 12. When the elastomer strip 14 is completely inserted into the metal strip 12, the elastomer strip 14 is positioned with respect to the metal strip 12 such that the base portion 38 of the elastomer strip 14 overlies and extends along the base member 16 of the metal strip 12, while the extension portion 40 of the elastomer strip 14 extends along the fingers 18 of the metal strip 12. The free end of the extension portion 40 is positioned between the fingers 18 and the tip portions 24. Further, the seal portion 42 of the elastomer strip 14 is positioned beyond the lip 26 which extends from the edge of the metal strip 12 and the seal portion 42 extends along the length of the metal strip 12.

Figure 17:
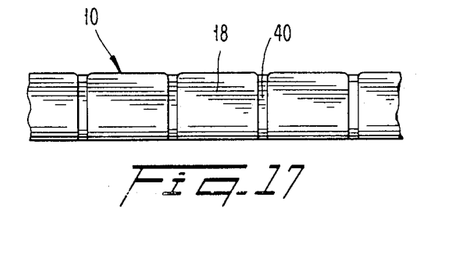
FIG. 17 is a rear view of a portion of the electromagnetic shielding and environmental sealing device.

FIG. 17 shows the elastomer strip 14 inserted into the metal strip 12 and specifically shows how the extension portion 40 of the elastomer strip extends along the fingers 18 to thereby interconnect the spaced fingers 18.

Figure 15:
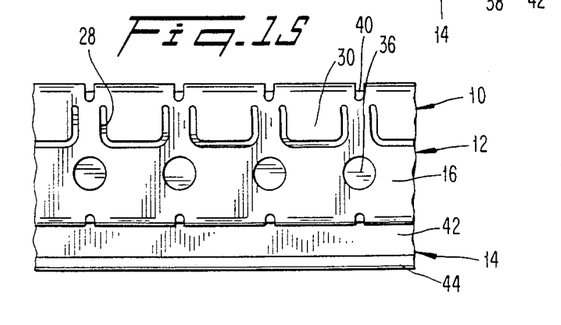
FIG. 15 is a bottom view of a portion of the electromagnetic shielding and environmental sealing device.

FIG. 15 also shows the elastomer strip 14 inserted into the metal strip 12 and in particular illustrates the fact that the sealing portion 42 extends beyond the edge of the metal strip 12.

As noted above, the metal strip 12 is initially manufactured so that the tip portions 24 are positioned perpendicular to the base member 16. However, after the elastomer strip 14 has been inserted into the metal strip 12, the tip portions 24 are pressed back towards the fingers 18. Preferably, as seen in FIG. 1, the tip portions 24 are pressed back towards the fingers 18 so that they extend substantially parallel to the fingers 18. The force exerted by the tip portions 24 on the extension portion 40 of the elastomer strip 14 when the tip portions 24 are pressed back towards the fingers 18 preloads the extension member 40. The preloading of the extension portion 40 serves several useful functions. The force exerted by the tip portions 24 on the extension portion 40 holds the elastomer strip 14 and retains it in place relative to the metal strip 12. That holding and retaining force can be used as the initial means for holding the elastomer strip 14 in place prior to applying or utilizing an adhesive or any other type of securing means to secure the elastomer strip 14 to the metal strip 12. Alternatively, the force exerted by the tip portions 24 on the extension portion 40 can be used as the securing means for securing the elastomer strip 14 to the metal strip 12.

Preloading the extension portion 40 of the elastomer strip 14 by pressing the tip portions 24 towards the fingers 18 results in all of the spaced fingers 18 being connected together. Thus, the snag resistance of the device 10 is increased. Further, since all of the spaced fingers 18 are connected together by virtue of the single extension portion 40 of the elastomer strip 14, the fingers 18 tend to act in unison. For example, if a force is applied to a single one of the fingers 18, that finger 18 tends to bend downward towards the base portion 38 and consequently, the contact tab 30 associated with that finger 18 is deflected. However, when the single finger 18 to which the force is applied bends downward, the adjoining fingers 18 on either side of the one finger 18 also bend downward due to the fact that the fingers 18 are all interconnected by the extension portion 40 of the elastomer strip 14. Consequently, the contact tabs 30 associated with the adjoining fingers 18 are also deflected. It can be seen, therefore, that the presence of the extension portion 40 tends to make the fingers 18 behave as a group rather than individually.

Figure 19:
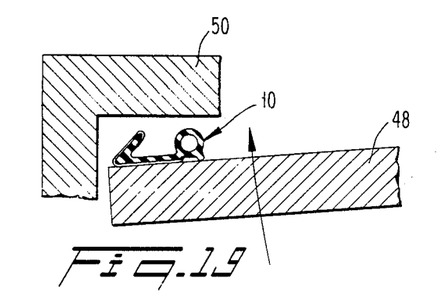
FIG. 19 is a side view in cross-section of the device of FIG. 1, in reduced scale, secured to a surface of one hinged member during swinging movement of the member to a closed position.
Figure 20:
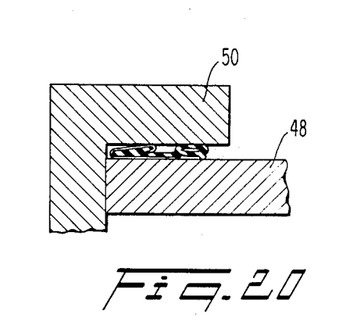
FIG. 20 is a side view in cross-section of the device of FIG. 1, in reduced scale, secured to a surface of one hinged member after the hinged member is brought into close association with the adjoining member forming the joint.
Figure 21:
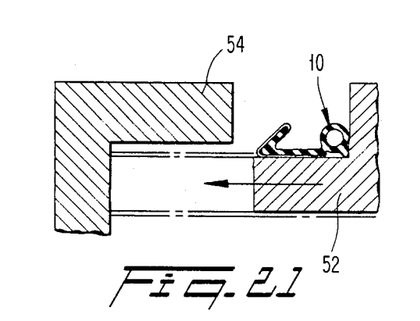
FIG. 21 is a side view in cross-section of the device of FIG. 1, in reduced scale, secured to a surface of one slidable member during movement of the member to a closed position.
Figure 22:
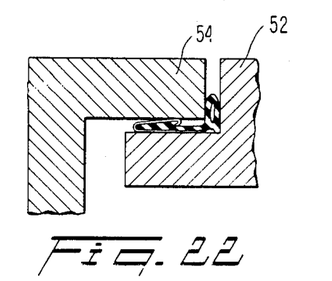
FIG. 22 is a side view in cross-section of the device of FIG. 1, in reduced scale, secured to a surface of one slidable member after the slidable member is brought into close association with the adjoining member forming the joint.

Turning now to the use and operation of the device according to the preferred embodiments of the present invention, FIG. 19 shows the device 10 attached to the surface of a hinged member 48 such as a hinged door, panel or the like, as the member 48 is swung towards the member 50. FIG. 20 shows the device 10 in a compressed state between the surfaces of the hinged member 48 and the member 50 after the hinged member 48 is brought into opposing relation to the adjoining member 50 that forms the joint. FIG. 21 depicts the device 10 attached to the surface of a slidable member 52 such as a slidable door, access panel or the like, as the member 52 is slid towards the member 54. FIG. 22 shows the device 10 compressed between the surfaces of the slidable member 52 and the member 54 after the slidable member 52 is brought into opposing relation to the adjoining member 54 that forms the joint.

As the device 10 is compressed between the opposing surfaces of members 48, 50 and 52, 54, the device 10 is deformed as partially shown in FIG. 8. It is to be understood that the effect of the compressive force on the entire device 10 is not illustrated in FIG. 8. As can be seen from FIG. 8, when a force is applied to the device 10, such as the force produced when the opposing surfaces defining the joint are brought into opposing relation, the fingers 18 of the metal strip 12 and the extension portion 40 of the elastomer strip 14 are moved in the direction shown by the arrow. The application of such a force to the device 10 and the subsequent movement of the fingers 18 and the extension portion 40 causes the bend 60 to be raised up off the surface of the member to which it is attached. The gap between the bottom surface of the device 10 and the surface to which the device 10 is attached that results from the raising of the bend 60 tends to reduce the shielding effectiveness of the device. However, the present invention overcomes that problem by providing the rectangular contact tabs 30. In that respect and as illustrated in FIG. 8, when the fingers 18 and extension portion 40 are subjected to a compressive force and moved in the direction of the arrow, the rectangular contact tab 30 is deflected downward, thereby contacting the underlying surface. Thus, even though the bend 60 is raised, the rectangular contact tab 30 serves to maintain electrical contact with the surface to which the device 10 is attached and consequently, the shielding effectiveness of the device 10 is not reduced.

As the extension portion 40 deflects downward towards the base portion 38, the elastomer material tends to bunch up at the point where the extension portion 40 merges with the base portion 38 (i.e., at the knuckle). The elastomer material continues to bunch up at the knuckle as the extension portion 40 is deflected further and further downward. As more and more of the elastomer material bunches up, the part of the extension portion 40 that actually pivots is decreasing because the continual bunching up of the elastomer material reduces the effective free length of the extension portion 40. Eventually, there will come a point when the bunching of the elastomer material causes the elastomer material near and around the knuckle to turn solid, thereby resisting further deflection of the extension portion 40 along its entire length.

As was discussed above, the presence of the elastomer strip 14 helps distribute the stress in the metal strip 12 so that the stress build-up at the bend 60 is limited. In particular, as the extension portion 40 is initially deflected, the stress at the bend 60 in the metal strip 12 increases until the elastomer turns solid. Thereafter, deflection of the extension portion 40 causes the point of localized bending to move away from the bend 60 and along the fingers 18. The stress distribution in the metal strip 12 thus changes as a result of the resistance force produced by the knuckle portion of the elastomer strip 14. The resistance force produced by the knuckle portion of the elastomer strip is effective further up the fingers 18 and further away from the bend 60 in response to further deflection of the extension portion due to the build-up of elastomer material in the knuckle. Thus, the continued deflection of the extension portion 40 significantly changes the distribution of stress in the metal strip 12 and the fingers 18. It can be seen, therefore, that the location of the stress increase continually changes as a result of the continued build-up of the elastomer material.

Preferably, the elastomer strip 14 is designed such that the extension portion 40 can deflect to a position approximately one-half of its free height. In other words, taking the free height of the extension portion 40 in the undeflected state to be as shown in FIG. 1, the height of the extension portion 40 after maximum deflection, i.e., after the elastomer material reaches a solid state due to the bunching up of the elastomer material, is approximately equal to one-half of D.

If fasteners are employed for securing the device 10 to the desired surface, the heads of the fasteners may interfere with the deflection of the extension portion 40. Thus, in that situation, the extension portion 40 may not be capable of deflecting to the extent described above.

As was discussed above, the continued deflection of the extension portion 40 causes more and more of the extension portion 40 to bunch up, thereby decreasing the length of the extension portion 40. As the length of the extension portion 40 decreases the stiffness increases due to the shorter length of the extension portion 40. As the stiffness increases, the extension portion's 40 resistance to deflection similarly increases and thus, the deflection of the extension portion 40 decreases. Moreover, since the deflection of the extension portion 40 is a function of the third power of the length of the extension portion 40, the deflection decreases non-linearly in response to the force applied to the extension portion 40 of the elastomer strip 14.

In addition to the above operational features of the present invention, the device 10 according to the preferred embodiments serves to seal the joint defined by the opposing surfaces of members 48, 50 and 52, 54 from the potentially harmful effects of environmental conditions. As seen in FIG. 20, when the device 10 is positioned between the opposing surfaces of the members 48, 50 the sealing portion 42 tends to prevent the entry of dirt, dust or other potentially harmful elements into the joint. Similarly, as shown in FIG. 22, when the device 10 is compressed between the surfaces of the members 52, 54, the sealing portion 42 of the device 10 helps ensure that environmental elements such as dirt, dust and the like will not enter the joint. Thus, the device 10 according to the preferred embodiments of the present invention is highly effective not only in the electromagnetic shielding of a joint but in addition, is highly effective in the environmental sealing of such joints. It is of course understood that the device of the present invention could be used in the electromagnetic shielding and environmental sealing of two relatively movable surfaces as well.

In addition to the aforementioned advantages, the present invention provides a device that can be used in structures that have sliding members, i.e., sliding doors, access panels and the like, as illustrated in FIGS. 21 and 22, as well as in structures having hinged, swinging members, i.e., hinged doors, access panels and the like, as illustrated in FIGS. 19 and 20. Thus, the need to employ different types of electromagnetic shielding and environmental sealing devices depending upon the particular form of movement of the member to which it is attached is eliminated.

A further advantage of the electromagnetic shielding and environmental sealing device 10 in accordance with the present invention involves the use of the device in structures and housings having hinged, swinging doors, panels and the like. When the device 10 is attached to a swinging member, the opposing surface of the structure that forms the joint moves across the outer surface of the fingers 18 and produces a wiping-type action. Many prior art devices are not capable of being used in conjunction with swinging members that produce such a wiping-type action because they simply are not designed to accommodate the forces produced as a result of that type of movement. On the other hand, those devices that are capable of accommodating the wiping-type action of hinged, swinging members are not capable of being used in conjunction with doors that slide. The present invention can easily accommodate the forces produced by both swinging members and sliding members.

The present invention is well suited for use in conjunction with swinging members that produce a wiping-type action due to the wedge-shaped outer surface of the device 10 as well as the previously mentioned, somewhat unitary movement of the fingers 18. As the swinging member to which the device 10 is attached moves, the opposing surface of the structures or housing that defines the joint begins to wipe across the outer surface of the fingers 18 beginning at one end of the device 10. Since all of the fingers 18 are interconnected as a result of the extension portion 40 of the elastomer strip 14, when the opposing surface of the joint begins to wipe across the outer surface of the fingers 18 to thereby deflect the fingers 18 that are in immediate contact with the opposing surface, the fingers 18 not yet in contact with the opposing surface but adjacent to those that are in contact, will also tend to deflect as a result of the unitary movement of the fingers produced by the extension portion 40. Thus, the wiping action of the opposed surface across the device will be smooth.

The principles, preferred embodiments and modes of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others without departing from the spirit of the present invention. Accordingly, it is expressly intended that all such variations and changes which fall within the spirit and scope of the present invention as defined in the claims, be embraced thereby.

What is claimed is:

1. An electromagnetic shielding and environmental sealing device comprising:
   an elastomer strip that includes means for environmental sealing of a joint; and
   a metal strip that includes a base member and a plurality of spaced fingers integrally connected to and extending at an angle from one edge of said base member with a portion of said elastomer strip extending along said fingers, said base member including means for permitting a portion of said base member to be deflected out of the plane l defined by immediately adjoining portions of said base member when a force is applied to said fingers and for providing an electromagnetic shielding function.

2. An electromagnetic shielding and environmental sealing device in accordance with claim 1, wherein said means for permitting a portion of said base member to be deflected comprises at least one cut-out area that defines a contact tab.

3. An electromagnetic shielding and environmental sealing device in accordance with claim 2, wherein said cutout area is U-shaped and said contact tab is rectangular.

4. An electromagnetic shielding and environmental sealing device in accordance with claim 3, wherein each of said fingers is defined by two sides, said rectangular contact tab being associated with one of said fingers and being defined by two sides, said rectangular contact tab being positioned with respect to the associated finger such that imaginary extensions which define the sides of the contact tab are positioned between the sides which define the associated finger.

5. An electromagnetic shielding and environmental sealing device in accordance with claim 1, wherein said means for permitting a portion of said base member to be deflected comprises a plurality of cut-out areas, each of which defines a contact tab.

6. An electromagnetic shielding and environmental sealing device in accordance with claim 5, wherein said cutout areas are U-shaped and said contact tabs are rectangular.

7. An electromagnetic shielding and environmental sealing device in accordance with claim 6, wherein each of said fingers is defined by two sides, each of said rectangular contact tabs being associated with one of said fingers and each of said rectangular contact tabs being defined by two sides, each of said rectangular contact tabs being positioned with respect to the associated finger such that imaginary extensions of the sides which define each of the contact tabs are positioned between the sides which define the associated finger.

8. An electromagnetic shielding and environmental sealing device in accordance with claim 1, wherein said elastomer strip comprises a base portion and an extension portion integrally connected to and extending at an angle from one edge of the base portion, said means for environmentally sealing a joint including a sealing portion integrally connected to an opposite edge of the base element.

9. An electromagnetic shielding and environmental sealing device in accordance with claim 8, wherein said sealing portion comprises a hollow cylinder.

10. An electromagnetic shielding and environmental sealing device in accordance with claim 8, wherein a free end of each of the fingers has a tip portion integrally connected thereto that extends back towards said finger at an angle.

11. An electromagnetic shielding and environmental sealing device in accordance with claim 10, wherein the elastomer strip is positioned with respect to said metal strip such that the base portion of said elastomer strip extends along the base member of said metal strip, the extension portion of said elastomer strip extends along said fingers and the sealing portion of said elastomer strip is positioned beyond an edge of said base member of said metal strip.

12. A electromagnetic shielding and environmental sealing strip in accordance with claim 11, wherein a free end of the extension portion is positioned between the fingers and tip portions of said metal strip.

13. An electromagnetic shielding and environmental sealing device in accordance with claim 1, wherein the base portion of said elastomer strip is adhesively attached to the base member of said metal strip.

14. An electromagnetic shielding and environmental sealing device in accordance with claim 1, wherein said base member of said metal strip includes means for attaching the device to a surface.

15. An electromagnetic shielding and environmental sealing device in accordance with claim 14, wherein said means for attaching comprises a plurality of spaced fastening holes.

16. An electromagnetic shielding and environmental sealing device in accordance with claim 1, wherein all of said fingers are substantially coplanar.

17. An electromagnetic shielding and environmental sealing device in accordance with claim 1, wherein the elastomer strip includes a base portion and an extension portion integrally connected to and extending at an angle from one edge of the base portion, the fingers of the metal strip meeting the base member of the metal strip at a bend and the thickness of the elastomer strip being such that the stress in the bend of the metal strip is distributed to the fingers of the metal strip in response to deflection increases of the fingers and the extension portion towards the base of the elastomer strip.

18. An electromagnetic shielding and environmental sealing device comprising:
   an elastomer strip that includes means for environmental sealing of a joint; and
   a metal strip that includes a base member and a plurality of spaced fingers integrally connected to and extending at an angle from one edge of said base member, said base member including at least one cut-out area defining a contact tab for electromagnetic shielding of the joint, whereby said contact tab is capable of being deflected out of a plane defined by immediately adjoining portions of said base member when a force is applied to said fingers, said elastomer strip being positioned with respect to said metal strip such that a portion of said elastomer strip extends along the base member of said metal strip and a portion of said elastomer strip extends along said fingers.

19. An electromagnetic shielding and environmental sealing device in accordance with claim 18, wherein said base member includes a plurality of cut-out areas, each of which defines a contact tab that is defined by two sides, each cutout area being U-shaped and each contact tab being rectangular.

20. An electromagnetic shielding and environmental sealing device in accordance with claim 19, wherein each contact tab is associated with one of said fingers and is positioned with respect to the associated finger such that imaginary continuations of the sides which define each of the contact tabs are positioned between sides which define the associated finger.

21. An electromagnetic shielding and environmental sealing device in accordance with claim 18, wherein a free end of each of the fingers has a tip portion integrally connected thereto that extends back towards said finger at an angle.

22. An electromagnetic shielding and environmental sealing device in accordance with claim 21, wherein said elastomer strip comprises a base portion and an extension portion integrally connected to and extending at an angle from an edge of said base portion, said means for environmental sealing of the joint including a sealing portion integrally connected to an opposite edge of the base portion, said elastomer strip being positioned with respect to said metal strip such that the base portion of said elastomer strip extends along the base member of said metal strip and the extension portion of said elastomer strip extends along said fingers, the sealing portion of said elastomer strip being positioned beyond an edge of said base member of said metal strip.

23. An electromagnetic shielding and environmental sealing device in accordance with claim 18, wherein the elastomer strip includes a base portion and an extension portion integrally connected to and extending at an angle from one edge of the base portion, the fingers of the metal strip meeting the base member of the metal strip at a bend and the thickness of the elastomer strip being such that the stress in the bend of the metal strip is distributed to the fingers of the metal strip in response to deflection increases of the fingers and the extension portion towards the base portion of the elastomer strip.

24. An electromagnetic shielding and environmental sealing device comprising:
    an elastomer strip that includes a base portion, an extension portion integrally connected to one edge of said base portion, and means for environmental sealing of a joint integrally connected to an opposite edge of the base portion, said elastomer strip further including means for non-linearly decreasing the deflection of said extension portion in response to a force applied to said device; and
    a metal strip that includes a base member, a plurality of spaced fingers integrally connected to one edge of said base member and means for electromagnetic shielding of the joint, said extension portion extending along said fingers.

25. An electromagnetic shielding and environmental sealing device in accordance with claim 24, wherein said means for non-linearly decreasing the deflection of said extension portion includes said extension portion extending from said base portion at an angle.

26. An electromagnetic shielding and environmental sealing device in accordance with claim 24, wherein said means for electromagnetic shielding of the joint includes at least one cut-out area in said base member defining at least one contact tab in said base member that is capable of being deflected out of a plane defined by immediately adjoining areas of said base member when a force is applied to said fingers.

27. An electromagnetic shielding and environmental sealing device in accordance with claim 25, wherein said at least one cut-out area comprises a plurality of U-shaped cut-out areas in said base member, each of which defines a rectangular contact tab in said base member.

* * * * *